US012701678B2

(12) United States Patent
Zhu et al.

(10) Patent No.: US 12,701,678 B2
(45) Date of Patent: Aug. 4, 2026

(54) SERVER AND LIQUID-COOLING SYSTEM FOR SERVER

(71) Applicant: SUZHOU METABRAIN INTELLIGENT TECHNOLOGY CO., LTD., Suzhou (CN)

(72) Inventors: Huanlai Zhu, Suzhou (CN); Guangzhi Liu, Suzhou (CN); Longting Li, Suzhou (CN); Xiaowei Zhang, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 19/116,969

(22) PCT Filed: Apr. 24, 2024

(86) PCT No.: PCT/CN2024/089638
§ 371 (c)(1),
(2) Date: Mar. 28, 2025

(87) PCT Pub. No.: WO2025/077146
PCT Pub. Date: Apr. 17, 2025

(65) Prior Publication Data
US 2026/0013084 A1 Jan. 8, 2026

(30) Foreign Application Priority Data

Oct. 10, 2023 (CN) .......................... 202311303113.4

(51) Int. Cl.
*H05K 7/20* (2006.01)

(52) U.S. Cl.
CPC ..... *H05K 7/20809* (2013.01); *H05K 7/20236* (2013.01); *H05K 7/20281* (2013.01);
(Continued)

(58) Field of Classification Search
CPC .. H05K 7/20; H05K 7/20203; H05K 7/20236; H05K 7/20254; H05K 7/20272;
(Continued)

(56) References Cited

U.S. PATENT DOCUMENTS

2022/0264768 A1* 8/2022 Horng ................ H05K 7/20327
2022/0322570 A1* 10/2022 Meneboo ........... H05K 7/20272
(Continued)

FOREIGN PATENT DOCUMENTS

CN 209590758 U 11/2019
CN 210008126 U 1/2020
(Continued)

OTHER PUBLICATIONS

CN-115066157-A English Translation (Year: 2022).*

*Primary Examiner* — Amir A Jalali
(74) *Attorney, Agent, or Firm* — IPro, PLLC

(57) ABSTRACT

A server and a liquid-cooling system for a server. The server according to the present application includes a crate; a partitioning component provided inside the crate, and adapted for partitioning the interior of the crate into a two-phase cold-plate liquid-cooling region and a single-phase submersion region; a first power consuming component provided within the two-phase cold-plate liquid-cooling region; a second power consuming component provided within the single-phase submersion region, wherein the single-phase submersion region is adapted for performing heat dissipation to the second power consuming component, and the power consumption of the first power consuming component is greater than the power consumption of the second power consuming component; and a first heat exchanger provided on one side of the two-phase cold-plate
(Continued)

liquid-cooling region, wherein the first heat exchanger is adapted for cooling the two-phase cold-plate liquid-cooling region.

13 Claims, 5 Drawing Sheets

(52) U.S. Cl.
CPC ..... *H05K 7/20327* (2013.01); *H05K 7/20381* (2013.01); *H05K 7/20772* (2013.01); *H05K 7/20272* (2013.01)

(58) Field of Classification Search
CPC ........... H05K 7/20282; H05K 7/20263; H05K 7/20318; H05K 7/20327; H05K 7/20336; H05K 7/20381; H05K 7/2039; H05K 7/20772; H05K 7/20781; H05K 7/20809; H05K 7/20818; H05K 7/20836; G06F 1/20; G06F 1/181; G06F 1/183; G06F 2200/201; H10W 40/30; Y02D 10/00
See application file for complete search history.

(56) References Cited

U.S. PATENT DOCUMENTS

| | | | |
|---|---|---|---|
| 2023/0156960 A1* | 5/2023 | Ramakrishnan ... | H05K 7/20809 361/679.53 |
| 2023/0189484 A1* | 6/2023 | Gao ...................... | H05K 7/208 361/700 |
| 2023/0217630 A1* | 7/2023 | Gao ................... | H05K 7/20318 361/699 |

FOREIGN PATENT DOCUMENTS

| | | | |
|---|---|---|---|
| CN | 112445305 A | 3/2021 | |
| CN | 115066157 A | * 9/2022 | ............ H05K 7/203 |
| CN | 117055708 A | 11/2023 | |

* cited by examiner

SERVER AND LIQUID-COOLING SYSTEM FOR SERVER

CROSS-REFERENCE TO RELATED APPLICATION

The present application claims the priority of the Chinese patent application filed on Oct. 10, 2023 before the Chinese Patent Office with the application number of 202311303113.4 and the title of "SERVER AND LIQUID-COOLING SYSTEM FOR SERVER", which is incorporated herein in its entirety by reference.

FIELD

The present application relates to the technical field of computers, and particularly relates to a server and a liquid-cooling system for a server.

BACKGROUND

As cloud computing and big data are rapidly developing, the explosive growth of the data volume promotes the high-speed development of the market of data centers. As the power that servers are required to support is increasingly higher, air-cooling systems gradually cannot satisfy the requirements on refrigeration by current servers, and liquid-cooling heat-dissipation systems emerge accordingly.

However, multiple types of power consuming components are provided inside a server, for example, interfaces, central processing units, memory banks and hard disks. The different power consuming components have unequal heat-flux densities, and different requirements on the cooling efficiency. That causes that, in the related art, the cooling efficiency of a liquid-cooling heat-dissipation system tends not to match with the heat-flux densities of some of the power consuming components inside the crate, and it is difficult to satisfy the demand on cooling of the some of the power consuming components.

SUMMARY

In view of the above, the present application provides a server and a liquid-cooling system for a server.

In the first aspect, the present application provides a server, wherein the server comprises:

a crate;

a partitioning component provided inside the crate, and adapted for partitioning an interior of the crate into a two-phase cold-plate liquid-cooling region and a single-phase submersion region;

a first power consuming component provided within the two-phase cold-plate liquid-cooling region;

a second power consuming component provided within the single-phase submersion region, wherein the single-phase submersion region is adapted for performing heat dissipation to the second power consuming component, and a power consumption of the first power consuming component is greater than a power consumption of the second power consuming component; and a first heat exchanger provided on one side of the two-phase cold-plate liquid-cooling region, wherein the first heat exchanger is adapted for cooling the two-phase cold-plate liquid-cooling region.

The Advantageous Effect:

In the server according to the embodiments of the present application, the partitioning component partitions the interior of the crate into the single-phase submersion region and the two-phase cold-plate liquid-cooling region. The first power consuming component of the higher power consumption can be provided within the two-phase cold-plate liquid-cooling region, and the refrigerant inside the first heat exchanger can have phase transformation and take away a large amount of heat, to obtain a high cooling efficiency, which may satisfy the demand on cooling of the first power consuming component. The second power consuming component of the lower power consumption can be provided within the single-phase submersion region, and the refrigerant within the single-phase submersion region can directly contact the second power consuming component and cool it, which may match with the heat-flux density of the second power consuming component.

In addition, because, in the present embodiment, within the single-phase submersion region it is merely required to provide the second power consuming component, the power consuming components within the single-phase submersion region have a low quantity, and therefore the single-phase submersion region is reduced to the largest extent. Even if repairment is required, because it has a small volume, and the refrigerant inside it has a low amount, the steps of evacuating it and filling the coolant are simple and convenient. Moreover, because the power consuming components within the single-phase submersion region have a low quantity, its inspection and repairment has a low frequency, whereby the difficulty in the maintenance of the server is not excessively increased. Therefore, the server according to the present embodiment may enable the liquid-cooling system to satisfy the demands on cooling of the first power consuming component and the second power consuming component at the same time, and has a good maintainability.

In an alternative embodiment, the single-phase submersion region and the two-phase cold-plate liquid-cooling region are in heat-exchanging connection.

The Advantageous Effect:

By using such a configuration, the single-phase submersion region and the two-phase cold-plate liquid-cooling region may be actively combined together, to simplify the steps required by the operator to access the server into the liquid-cooling system.

In an alternative embodiment, the crate is provided with a first inlet and a first outlet, both of the first inlet and the first outlet are in communication with the single-phase submersion region, the first heat exchanger has a second inlet and a second outlet, the first inlet is a refrigerant inputting port, the second inlet is in communication with the first outlet, and the second outlet is a refrigerant outputting port.

The Advantageous Effect:

By using such a configuration, the second power consuming component within the single-phase submersion region can pre-heat the refrigerant, so that the refrigerant can enter the first heat exchanger in a state close to the saturation temperature. That reduces the quantity of the components required by the liquid-cooling system, thereby facilitating to reduce the volume of the liquid-cooling system, and may reduce the electricity consumption of the liquid-cooling system, thereby reducing the burden of heat dissipation of the condenser.

In an alternative embodiment, a first flow guiding member is provided within the single-phase submersion region, the first flow guiding member is adapted for partitioning an interior of the single-phase submersion region into a first cooling region and a second cooling region, the second power consuming component is provided within both of the first cooling region and the second cooling region, a first flowing-through port is formed between the first cooling region and the second cooling region, the first inlet is in communication with the first cooling region, and the first outlet is in communication with the second cooling region.
The Advantageous Effect:

The first flow guiding member can partition the single-phase submersion region into the first cooling region and the second cooling region, so that the refrigerant can sequentially pass through the first cooling region and the second cooling region and subsequently flow out of the first outlet, which prolongs the residence time of the refrigerant within the single-phase submersion region, and may facilitate the refrigerant to sufficiently cool the second power consuming component within the single-phase submersion region.

In an alternative embodiment, the first inlet and the first outlet are provided on one side of the single-phase submersion region, and the first flowing-through port is provided on the other side of the single-phase submersion region.
The Advantageous Effect:

By using such a configuration, a serpentine waterway can be formed within the single-phase submersion region, which effectively extends the flowing route of the refrigerant within the single-phase submersion region, thereby facilitating the refrigerant to sufficiently cool the second power consuming component within the single-phase submersion region.

In an alternative embodiment, the first inlet and the first outlet are provided on two sides of the crate, and the second power consuming component is provided between the first inlet and the first outlet.
The Advantageous Effect:

The refrigerant can enter the single-phase submersion region via the first inlet, sequentially pass through all of the second power consuming components within the single-phase submersion region, and subsequently flow out of the first outlet. By using such a configuration, the layout within the single-phase submersion region is simple, which facilitates to reduce the flow path and the flow resistance of the system.

In an alternative embodiment, the crate is provided with a first inlet and a first outlet, the server further comprises a second heat exchanger, the first inlet is a refrigerant inputting port, a cold-side inlet of the second heat exchanger is in communication with the first outlet, and a cold-side outlet of the second heat exchanger is a refrigerant outputting port; and the first heat exchanger comprises a second inlet and a second outlet, the second inlet is in communication with a hot-side outlet of the second heat exchanger, and the second outlet of the second heat exchanger is in communication with a hot-side inlet of the first heat exchanger.
The Advantageous Effect:

In the server according to the present embodiment, in usage, the first inlet can receive the low-temperature refrigerant outputted by the condenser, and the low-temperature refrigerant in the external can firstly enter the single-phase submersion region via the first inlet, cool the second power consuming component within the single-phase submersion region, and subsequently sequentially pass through the cold-side inlet and the cold-side outlet of the second heat exchanger.

The refrigerant inside the first heat exchanger can firstly cool the first power consuming component within the two-phase cold-plate liquid-cooling region, to absorb the heat of the first power consuming component to be gasified, to become a gas-liquid two-phase fluid, subsequently enter the hot side of the second heat exchanger via the hot-side inlet of the second heat exchanger, release the heat inside the hot side of the second heat exchanger to become the single-phase state, be discharged via the hot-side outlet of the second heat exchanger, and repeat the above process. The refrigerant inside the cold side of the second heat exchanger can exchange heat with the two-phase fluid, and subsequently be discharged via the refrigerant outputting port.

Furthermore, the liquid-cooling system is usually required to perform heat dissipation to a plurality of servers simultaneously. In the related art, the two-phase cold-plate-type liquid-cooling system is usually provided with a plurality of branches connected in parallel to each other, and each of the branches is adapted for performing heat dissipation to one of the servers. Because inside the two-phase cold-plate liquid-cooling system exists a two-phase fluid, flow-rate drifting easily happens in usage; in other words, if the power consumption of the power consuming component is higher, the proportion of the refrigerant that becomes the gaseous state is higher. Moreover, the specific volume of the gaseous-state refrigerant is above 100 times that of the liquid-state refrigerant, which causes that the flow rate of the refrigerant is also increased by 100 times. Further, because the resistance and the flow rate are of a square relation, which means that the flow resistance of the refrigerant is increased by above 10000 times, that further causes the flow rate of that branch to be sharply reduced.

Therefore, in the parallel-connected branches of the two-phase cold-plate liquid-cooling system, if the power consumption of the power consuming component is higher, the resistance inside the parallel-connected branches is higher, which causes lower flow rates inside the branches, which even results in dry heating. In the servers according to the present embodiment, the refrigerant inside the first heat exchanger may perform an independent internal circulation, and therefore the plurality of parallel-connected branches having the two-phase fluid are omitted, which may overcome the problem of dry heating caused by the higher resistance and lower flow rate with the higher power consumption inside the parallel-connected branches in the related art.

In an alternative embodiment, a mounting hole is formed in the partitioning component, the second heat exchanger is provided inside the mounting hole, the cold-side inlet and the cold-side outlet are located within the single-phase submersion region, and the hot-side inlet and the hot-side outlet are located within the two-phase cold-plate liquid-cooling region.
The Advantageous Effect:

By using such a configuration, that may facilitate the second heat exchanger to be connected to the single-phase submersion region and the two-phase cold-plate liquid-cooling region.

In an alternative embodiment, a second flow guiding member is formed within the single-phase submersion region, the second flow guiding member is adapted for partitioning the interior of the crate into a third refrigerating region and a fourth refrigerating region, the cold-side inlet is in communication with the third refrigerating region, the first inlet is in communication with the fourth refrigerating region, a second flowing-through port is formed between the second flow guiding member and a side wall of the crate, and the second power consuming component is provided within both of the third refrigerating region and the fourth refrigerating region.

The Advantageous Effect:

By using such a configuration, the second flow guiding member can guide the refrigerant within the single-phase submersion region to enter the cold-side inlet of the second heat exchanger, and extend the flowing route of the refrigerant within the single-phase submersion region, to facilitate the refrigerant to sufficiently cool the second power consuming component.

In an alternative embodiment, the first inlet is provided on one side of the single-phase submersion region, the cold-side inlet faces the other side of the single-phase submersion region, and the second flow guiding member comprises:

a first flow guiding plate extending from the second heat exchanger in a direction away from the first inlet, and located between two neighboring instances of the second power consuming component, wherein the second flowing-through port is formed between the first flow guiding plate and the side wall of the crate; and a second flow guiding plate having one end connected to the second heat exchanger, and the other end connected to an end of the first flow guiding plate that is closer to the second heat exchanger.

The Advantageous Effect:

The first flow guiding plate and the second flow guiding plate are adapted for partitioning the single-phase submersion region to obtain a serpentine waterway, which effectively extends the flowing route of the refrigerant within the single-phase submersion region, may facilitate the refrigerant to sufficiently cool the second power consuming component within the single-phase submersion region, and guides the refrigerant within the single-phase submersion region to flow into the cold-side inlet of the second heat exchanger.

In an alternative embodiment, a first circulating pump is provided within the two-phase cold-plate liquid-cooling region, an inputting end of the first circulating pump is connected to the hot-side outlet of the second heat exchanger, and an outputting end of the first circulating pump is connected to the hot-side inlet of the second heat exchanger.

The Advantageous Effect:

The first circulating pump is adapted for supplying power to the refrigerant circulation within the two-phase cold-plate liquid-cooling region. Moreover, the inputting end of the first circulating pump is connected to the hot-side outlet of the second heat exchanger, and the refrigerant flowing out of the hot-side outlet of the second heat exchanger is the liquid-state refrigerant, which does not easily affect the life and the reliability of the circulating pump.

In an alternative embodiment, the first power consuming component comprises an interface, a central processing unit, a memory bank and a graphics processor, and the second power consuming component comprises a power-supply unit and a hard disk.

The Advantageous Effect:

All of the first power consuming components are components that have a higher power consumption and a higher density and are relatively easy to dissipate heat by using a cold plate, and both of the second power consuming components are components that have a lower power consumption and are not suitable to dissipate heat by using a cold plate. That may ensure that the cooling efficiencies of the parts of the cooling system match with the power consuming components that they correspond to.

In an alternative embodiment, the first heat exchanger further comprises a first flow passage and a second flow passage, the first flow passage corresponds to the central processing unit and the graphics processor, the second flow passage corresponds to the interface and the memory bank, the second inlet is in communication with a first end of the first flow passage, a second end of the first flow passage is in communication with a first end of the second flow passage, and a second end of the second flow passage is in communication with the second outlet.

The Advantageous Effect:

By using such a configuration, the refrigerant can sequentially cool the central processing unit, the graphics processor, the interface and the memory bank and subsequently flow out of the second outlet. The refrigerant can preferentially pass through the power consuming components of a higher power consumption, which may enable the cooling efficiency of the condensing system to more match with the demand on cooling of the first power consuming components, to facilitate the refrigerant to more sufficiently cool the first power consuming components.

In an alternative embodiment, the first heat exchanger comprises a first branch and a second branch that are connected in parallel to each other, the first branch corresponds to the central processing unit, the second branch corresponds to the interface and the memory bank, the second inlet is in communication with a first end of the first branch and a first end of the second branch, and the second outlet is in communication with a second end of the first branch and a second end of the second branch.

The Advantageous Effect:

By using such a configuration, the refrigerant, when flowing inside the first heat exchanger, does not require an intensive turning, which may simplify the piping-system layout within the two-phase cold-plate liquid-cooling region, thereby reducing the flow path and the flow resistance of the system.

In an alternative embodiment, the central processing unit and the graphics processor are arranged separately in a first direction, the interfaces are provided on two sides in a second direction of the graphics processor, and the memory banks are provided on two sides in the second direction of the central processing unit, wherein the first direction and the second direction are perpendicular to each other.

The Advantageous Effect:

In the present embodiment, the positions of the second power consuming components within the two-phase cold-plate liquid-cooling region are distributed reasonably, which may enable the two-phase cold-plate liquid-cooling region to have a more compact internal structure.

In the second aspect, the present application further provides a liquid-cooling system for a server, wherein the system comprises:

the server in the first aspect of the present application; and a condenser having a third inlet and a third outlet, wherein the third inlet is connected to a refrigerant outputting port of the server, and the third outlet is in communication with a refrigerant inputting port of the server.

The Advantageous Effect:

The liquid-cooling system in the second aspect of the present application comprises or uses the server in the first aspect of the present application, and therefore has its advantageous effects; in other words, it may overcome the defect of the liquid-cooling systems in the prior art that the cooling efficiency does not match with the heat-flux densities of some of the power consuming components inside the crate and it is difficult to satisfy the demand on cooling of the some of the power consuming components.

In an alternative embodiment, the liquid-cooling system further comprises a second circulating pump, an inputting end of the second circulating pump is in communication with the third outlet of the condenser, and an outputting end of the second circulating pump is in communication with the refrigerant inputting port of the server.

The Advantageous Effect:

The second circulating pump may supply power to the circular flowing of the refrigerant inside the liquid-cooling system.

In an alternative embodiment, the liquid-cooling system further comprises a data collecting module and a controlling module, and the data collecting module comprises:

a first liquid-level sensor provided at the refrigerant inputting port of the server;

a second liquid-level sensor provided at the refrigerant outputting port of the server;

a third liquid-level sensor provided at the inputting end of the second circulating pump;

a first pressure sensor provided at the refrigerant inputting port of the server;

a second pressure sensor provided at the refrigerant outputting port of the server;

a first temperature sensor provided at the refrigerant inputting port of the server; and a second temperature sensor provided at the refrigerant outputting port of the server, wherein the controlling module is communicatively connected to the first liquid-level sensor, the second liquid-level sensor, the third liquid-level sensor, the first pressure sensor, the second pressure sensor, the first temperature sensor, the second temperature sensor and the second circulating pump, and is adapted for, according to detection results of the first liquid-level sensor, the second liquid-level sensor, the third liquid-level sensor, the first pressure sensor, the second pressure sensor, the first temperature sensor and the second temperature sensor, regulating an opening degree of the second circulating pump.

The Advantageous Effect:

By using such a configuration, the data collecting module may collect in real time the pressure inside the liquid-cooling system, so that the controlling module, according to the target values, regulates the opening and closing or the opening degree of the corresponding circulating pump, which may increase the degree of automation of the liquid-cooling system, and prevent errors caused by artificial regulation.

BRIEF DESCRIPTION OF THE DRAWINGS

In order to more clearly illustrate the technical solutions of the particular embodiments of the present application or the prior art, the figures that are required to describe the particular embodiments or the prior art will be briefly described below. Apparently, the figures that are described below are embodiments of the present application, and a person skilled in the art can obtain other figures according to these figures without paying creative work.

DESCRIPTION OF THE REFERENCE NUMBERS

Figure 1:
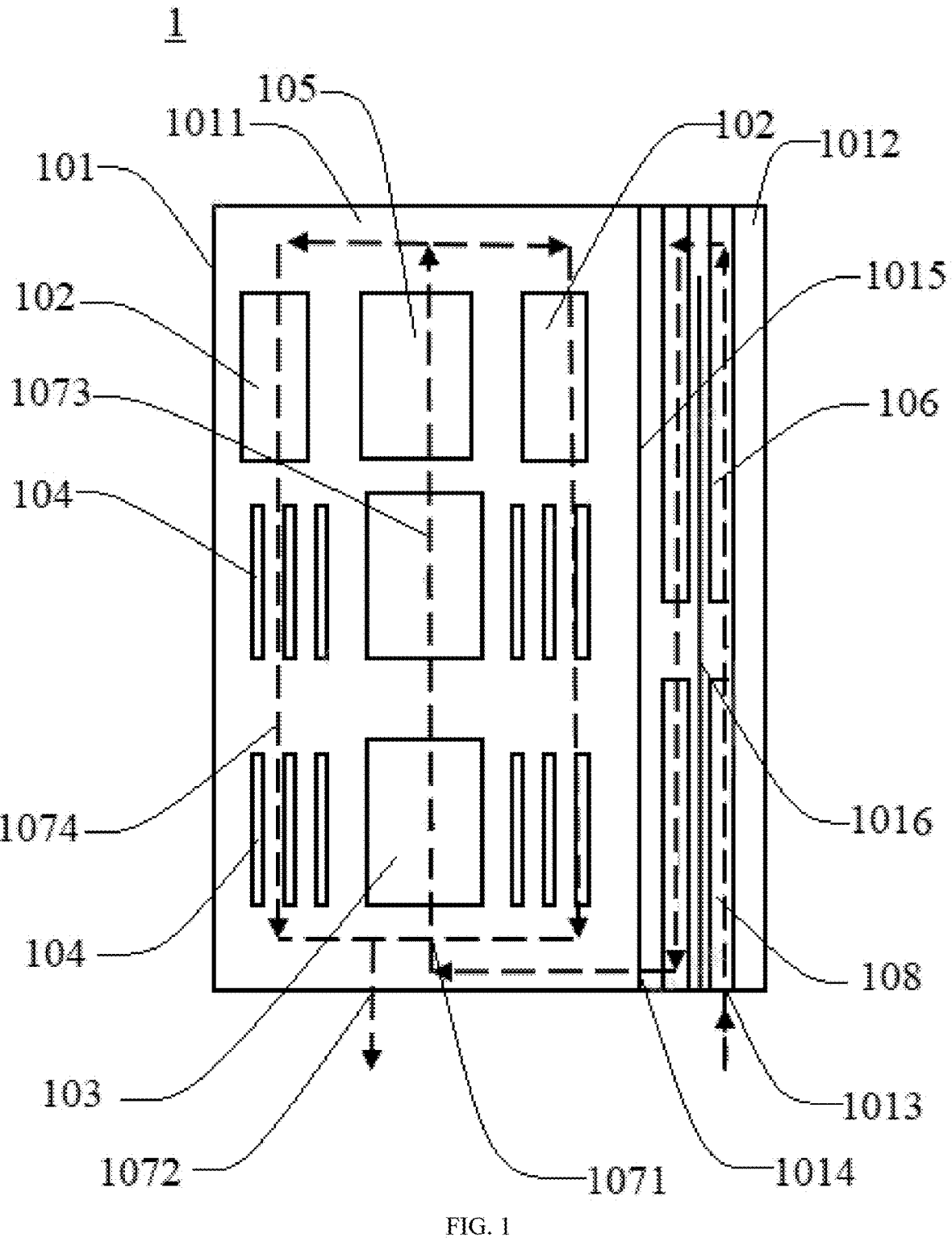
FIG. 1 is a schematic diagram of a server according to an embodiment of the present application.

1: server; 101: crate; 1011: two-phase cold-plate liquid-cooling region; 1012: single-phase submersion region; 1013: first inlet; 1014: first outlet; 1015: partitioning component; 1016: first flow guiding member; 1017: second flow guiding member; 10171: first flow guiding plate; 10172: second flow guiding plate; 102: interface; 103: central processing unit; 104: memory bank; 105: graphics processor; 106: power-supply unit; 1071: second inlet; 1072: second outlet; 1073: first flow passage; 1074: second flow passage; 1075: first branch; 1076: second branch; 108: hard disk; 109: first circulating pump; 110: second heat exchanger; 1101: cold-side inlet; 1102: cold-side outlet; 1103: hot-side inlet; 1104: hot-side outlet; 2: second circulating pump; 3: condenser; 301: third inlet; 302: third outlet; 5: data collecting module; and 6: controlling module.

DETAILED DESCRIPTION

In order to make the objects, the technical solutions and the advantages of the embodiments of the present application clearer, the technical solutions according to the embodiments of the present application will be clearly and completely described below with reference to the drawings according to the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the related art, liquid-cooling systems mainly include two-phase cold-plate-type liquid-cooling systems and single-phase submersion-type liquid-cooling systems. In a two-phase cold-plate liquid-cooling system, in usage, the refrigerant, by the driving by a circulating pump, flows into an evaporator, and, after has entered the evaporator, the refrigerant absorbs heat to change from the single-phase liquid state into a gas-liquid two-phase state. The two-phase fluid passes through a condenser to release the heat, subsequently changes from the gas-liquid two-phase state back into the liquid state, and re-enters the circulating pump, to form the entire circulation of heat absorption, delivering and heat releasing. Because the latent heat of the phase transformation is far greater than the sensible heat, the two-phase plate-type liquid-cooling systems have a higher cooling efficiency, the refrigerant inside the liquid-cooling system has a lower flow rate, and the circulating pump has a lower power consumption, which definitely has a lower energy utilization efficiency.

However, the two-phase cold-plate-type liquid cooling, as restricted by the structure of the cold plate, is not suitable to be applied to the components of a lower power consumption and a lower thermal electric-current density such as a hard disk and a power-supply unit. Moreover, although the single-phase submersion-type liquid-cooling systems are suitable for the heat dissipation of the components such as a hard disk and a power-supply unit, the server is entirely soaked inside the coolant. That causes that, when any one of the components inside the server is to be maintained, it is required to exhaust totally the refrigerant inside the system, and, after the component has been maintained or replaced, it is required to re-perform the pressure-maintaining test, and finally fill the coolant. That causes that the maintenance of the single-phase submersion-type liquid-cooling systems is inconvenient, and the single-phase submersion-type liquid-cooling systems have a lower refrigeration efficiency.

The embodiments of the present application will be described below with reference to FIGS. 1 to 3.

According to an embodiment of the present application, in an aspect, there is provided a server 1, comprising a crate 101, a partitioning component 1015, a first power consuming component, a second power consuming component and a first heat exchanger. The partitioning component 1015 is provided inside the crate 101, and adapted for partitioning the interior of the crate 101 into a two-phase cold-plate liquid-cooling region 1011 and a single-phase submersion region 1012. The first power consuming component is provided within the two-phase cold-plate liquid-cooling region 1011. The second power consuming component is provided within the single-phase submersion region 1012. The single-phase submersion region 1012 is adapted for performing heat dissipation to the second power consuming component. The power consumption of the first power consuming component is greater than the power consumption of the second power consuming component. The first heat exchanger is provided on one side of the two-phase cold-plate liquid-cooling region 1011, and the first heat exchanger is adapted for cooling the two-phase cold-plate liquid-cooling region 1011.

In the server 1 according to the embodiments of the present application, the partitioning component 1015 partitions the interior of the crate 101 into the single-phase submersion region 1012 and the two-phase cold-plate liquid-cooling region 1011. The first power consuming component of the higher power consumption can be provided within the two-phase cold-plate liquid-cooling region 1011, and the refrigerant inside the first heat exchanger can have phase transformation and take away a large amount of heat, to obtain a high cooling efficiency, which may satisfy the demand on cooling of the first power consuming component. The second power consuming component of the lower power consumption can be provided within the single-phase submersion region 1012, and the refrigerant within the single-phase submersion region 1012 can directly contact the second power consuming component and cool it, which may match with the heat-flux density of the second power consuming component.

Therefore, the server 1 according to the embodiments of the present application may overcome the defect of the liquid-cooling systems in the prior art that the cooling efficiency does not match with the heat-flux densities of some of the power consuming components inside the crate 101 and it is difficult to satisfy the demand on cooling of the some of the power consuming components.

Preferably, the first heat exchanger is a cold plate, and is connected to one side of the two-phase cold-plate liquid-cooling region 1011. The partitioning component 1015 is preferably, without limitation, a partition plate provided between the single-phase submersion region 1012 and the two-phase cold-plate liquid-cooling region 1011.

In addition, because, in the present embodiment, within the single-phase submersion region 1012 it is merely required to provide the second power consuming component, the power consuming components within the single-phase submersion region 1012 have a low quantity, and therefore the single-phase submersion region 1012 is reduced to the largest extent. Even if repairment is required, because it has a small volume, and the refrigerant inside it has a low amount, the steps of evacuating it and filling the coolant are simple and convenient. Moreover, because the power consuming components within the single-phase submersion region 1012 have a low quantity, its inspection and repairment has a low frequency, which significantly improves the maintainability of the server 1. Therefore, the server 1 according to the present embodiment may enable the liquid-cooling system to satisfy the demands on cooling of the first power consuming component and the second power consuming component at the same time, and has a good maintainability.

In an embodiment, the single-phase submersion region 1012 and the two-phase cold-plate liquid-cooling region 1011 are in heat-exchanging connection. By using such a configuration, the single-phase submersion region 1012 and the two-phase cold-plate liquid-cooling region 1011 may be actively combined together, to simplify the steps required by the operator to access the server 1 into the liquid-cooling system.

As an alternative embodiment, both of the single-phase submersion region 1012 and the two-phase cold-plate liquid-cooling region 1011 are provided with a refrigerant inlet and a refrigerant outlet, and can receive and discharge the refrigerant individually, and independently cool the power consuming components within them.

In an embodiment, the crate 101 is provided with a first inlet 1013 and a first outlet 1014. Both of the first inlet 1013 and the first outlet 1014 are in communication with the single-phase submersion region 1012. The first heat exchanger has a second inlet 1071 and a second outlet 1072, and the first inlet 1013 is a refrigerant inputting port. The second inlet 1071 is in communication with the first outlet 1014, and the second outlet 1072 is a refrigerant outputting port.

In the related art, the refrigerant, after has entered the evaporator, absorbs the heat, and changes from the single-phase liquid state into a gas-liquid two-phase state, and the two-phase fluid passes through a condenser 3 to release the heat, and subsequently change from the gas-liquid two-phase state back into the liquid state. In order to ensure that the refrigerant can enter the evaporator in a state close to the saturation temperature, to be capable of performing the phase transformation at the evaporator, to quickly take away the heat by using the phase-transformation latent heat, it is required to provide a preheater and a heat regenerator at the inlet of the evaporator. However, the provision of the preheater and the heat regenerator causes the liquid-cooling system to have many components and a large volume, which cannot satisfy the demands on integration, miniaturization and light weighting by the electronic heat-dissipation industry. Moreover, the preheater and the heat regenerator require additional electric-power supplying, which increases the electricity consumption of the system, and that part of electricity consumption is also converted into heat finally, which further increases the burden of the heat dissipation by the condenser 3.

In the present embodiment, the first heat exchanger has a second inlet 1071 and a second outlet 1072, and the first inlet 1013 is a refrigerant inputting port. The second inlet 1071 is in communication with the first outlet 1014, and the second outlet 1072 is a refrigerant outputting port. By using such a configuration, the second power consuming component within the single-phase submersion region 1012 can pre-heat the refrigerant, so that the refrigerant can enter the first heat exchanger in a state close to the saturation temperature. That reduces the quantity of the components required by the liquid-cooling system, thereby facilitating to reduce the volume of the liquid-cooling system, and may reduce the electricity consumption of the liquid-cooling system, thereby reducing the burden of heat dissipation of the condenser 3.

In an embodiment, as shown in FIG. 1, a first flow guiding member 1016 is provided within the single-phase submersion region 1012. The first flow guiding member 1016 is adapted for partitioning the interior of the single-phase submersion region 1012 into a first cooling region and a second cooling region, the second power consuming component is provided within both of the first cooling region and the second cooling region, and a first flowing-through port is formed between the first cooling region and the second cooling region. The first inlet 1013 is in communication with the first cooling region, and the first outlet 1014 is in communication with the second cooling region.

The first flow guiding member 1016 can partition the single-phase submersion region 1012 into the first cooling region and the second cooling region, so that the refrigerant can sequentially pass through the first cooling region and the second cooling region and subsequently flow out of the first outlet 1014, which prolongs the residence time of the refrigerant within the single-phase submersion region 1012, and may facilitate the refrigerant to sufficiently cool the second power consuming component within the single-phase submersion region 1012.

In an embodiment, the first inlet 1013 and the first outlet 1014 are provided on one side of the single-phase submersion region 1012, and the first flowing-through port is provided on the other side of the single-phase submersion region 1012. Preferably, the first flow guiding member 1016 is a partition plate formed within the single-phase submersion region 1012. One end of the partition plate is connected to the side wall of one side of the single-phase submersion region 1012 that is provided with the first inlet 1013, and the other end of the partition plate forms the first flowing-through port with the side wall of the other side of the single-phase submersion region 1012. By using such a configuration, a serpentine waterway can be formed within the single-phase submersion region 1012, which effectively extends the flowing route of the refrigerant within the single-phase submersion region 1012, thereby facilitating the refrigerant to sufficiently cool the second power consuming component within the single-phase submersion region 1012.

Figure 2:
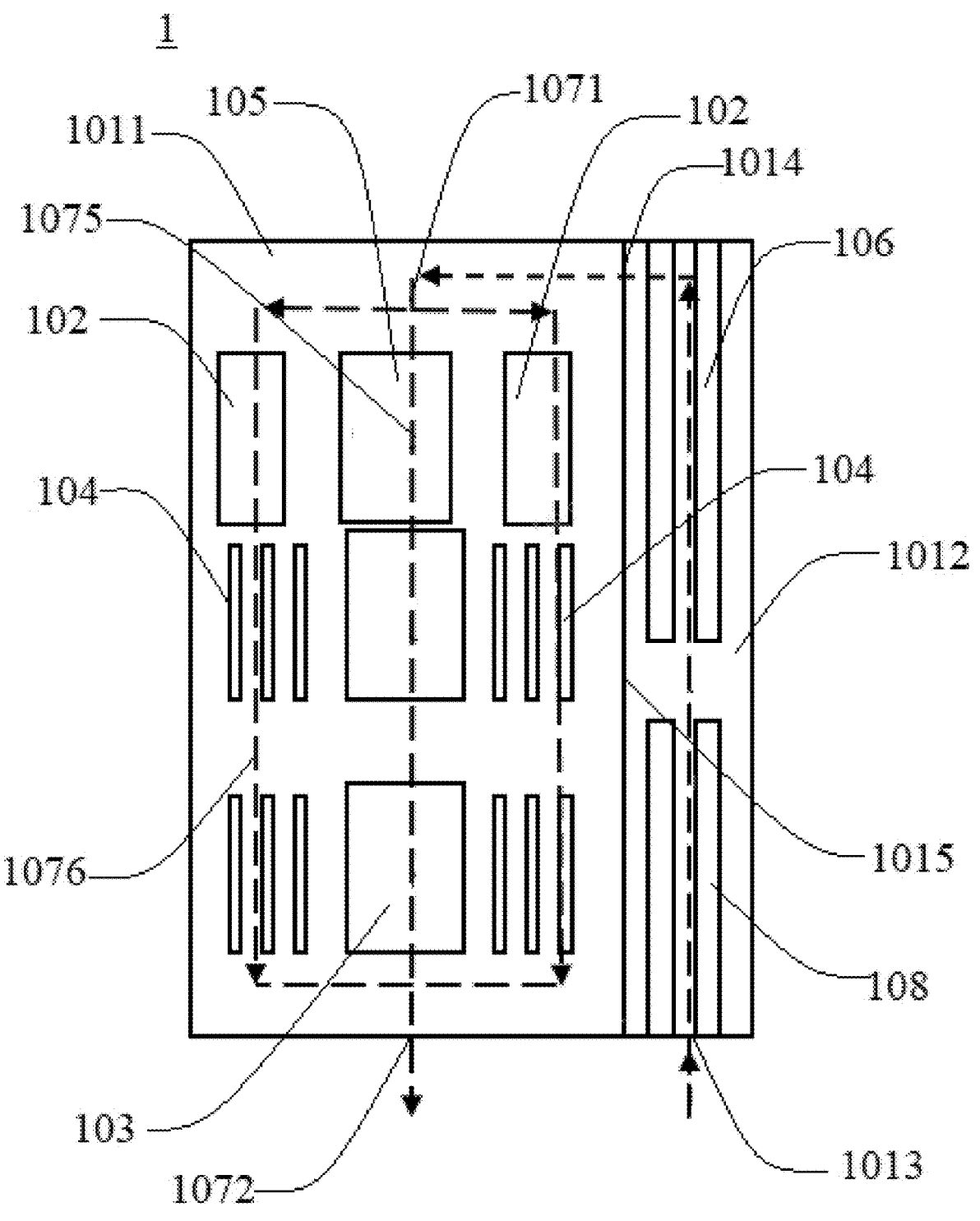
FIG. 2 is a schematic diagram of another server according to an embodiment of the present application.

In an embodiment, as shown in FIG. 2, the first inlet 1013 and the first outlet 1014 are provided on two sides of the crate 101. The second power consuming component is provided between the first inlet 1013 and the first outlet 1014.

The refrigerant can enter the single-phase submersion region 1012 via the first inlet 1013, sequentially pass through all of the second power consuming components within the single-phase submersion region 1012, and subsequently flow out of the first outlet 1014. By using such a configuration, the layout within the single-phase submersion region 1012 is simple, which facilitates to reduce the flow path and the flow resistance of the system.

Figure 3:
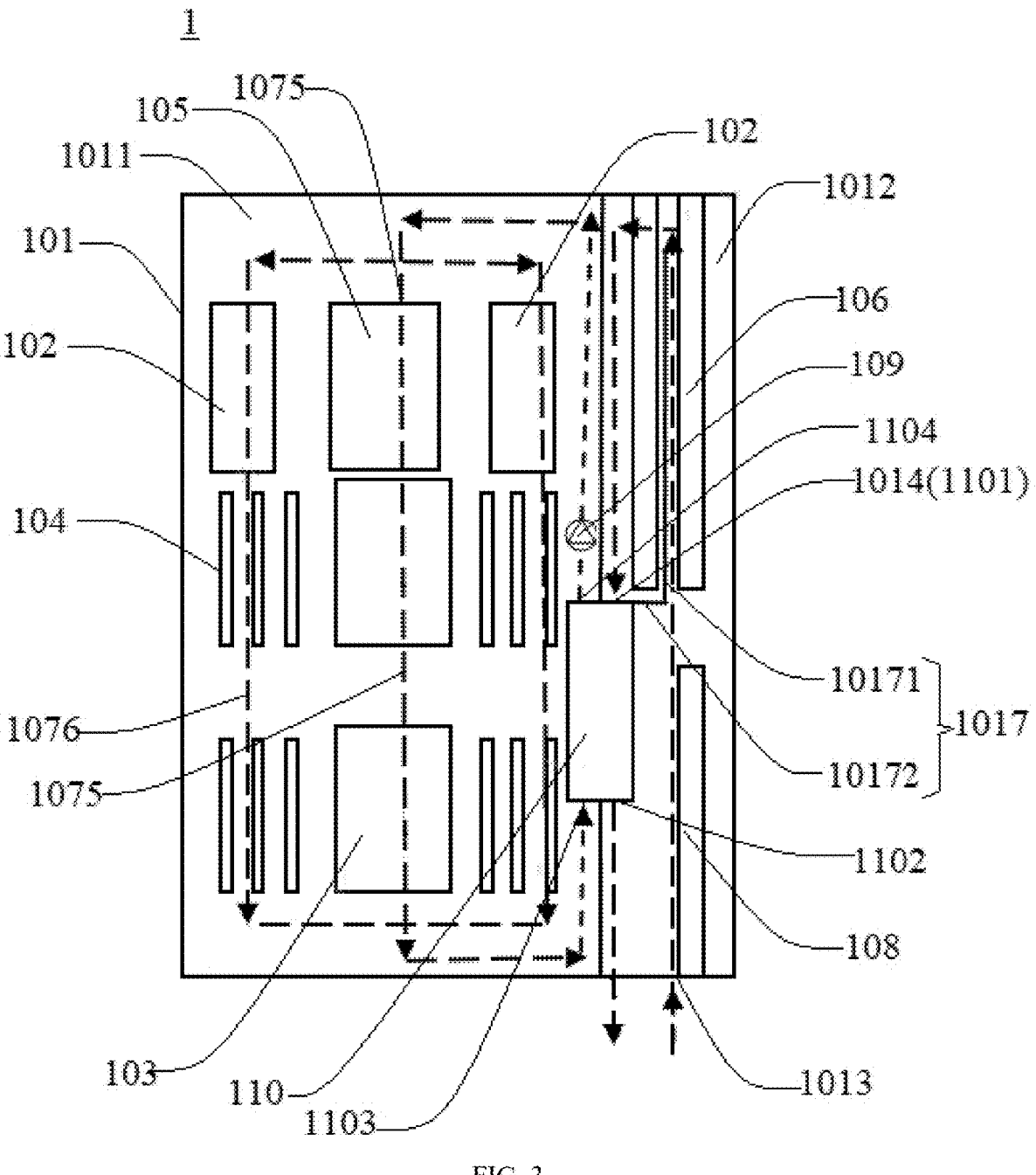
FIG. 3 is a schematic diagram of yet another server according to an embodiment of the present application.

In an embodiment, as shown in FIG. 3, the crate 101 is provided with a first inlet 1013 and a first outlet 1014. The server 1 further comprises a second heat exchanger 110. The first inlet 1013 is a refrigerant inputting port, a cold-side inlet 1101 of the second heat exchanger 110 is in communication with the first outlet 1014, and a cold-side outlet 1102 of the second heat exchanger 110 is a refrigerant outputting port.

The first heat exchanger comprises a second inlet 1071 and a second outlet 1072, the second inlet 1071 is in communication with a hot-side outlet 1104 of the second heat exchanger 110, and the second outlet 1072 of the first heat exchanger is in communication with a hot-side inlet 1103 of the second heat exchanger 110.

In the server 1 according to the present embodiment, in usage, the first inlet 1013 can receive the low-temperature refrigerant flowing out of the condenser inside the liquid-cooling system, and the low-temperature refrigerant can firstly enter the single-phase submersion region 1012 via the first inlet 1013, cool the second power consuming component within the single-phase submersion region 1012, and subsequently sequentially pass through the cold-side inlet and the cold-side outlet of the second heat exchanger 110.

The refrigerant inside the first heat exchanger can firstly cool the first power consuming component within the two-phase cold-plate liquid-cooling region 1011, to absorb the heat of the first power consuming component to be gasified, to become a gas-liquid two-phase fluid, subsequently enter the hot side of the second heat exchanger 110 via the hot-side inlet 1103 of the second heat exchanger 110, release the heat inside the hot side of the second heat exchanger 110 to become the single-phase state, be discharged via the hot-side outlet 1104 of the second heat exchanger 110, and repeat the above process. The refrigerant inside the cold side of the second heat exchanger 110 can exchange heat with the two-phase fluid, and subsequently be discharged via the refrigerant outputting port.

Furthermore, the liquid-cooling system is usually required to perform heat dissipation to a plurality of servers 1 simultaneously. In the related art, the two-phase cold-plate-type liquid-cooling system is usually provided with a plurality of branches connected in parallel to each other, and each of the branches is adapted for performing heat dissipation to one of the servers 1. Because inside the two-phase cold-plate liquid-cooling system exists a two-phase fluid, flow-rate drifting easily happens in usage; in other words, if the power consumption of the power consuming component is higher, the proportion of the refrigerant that becomes the gaseous state is higher. Moreover, the specific volume of the gaseous-state refrigerant is above 100 times that of the liquid-state refrigerant, which causes that the flow rate of the refrigerant is also increased by 100 times. Further, because the resistance and the flow rate are of a square relation, which means that the flow resistance of the refrigerant is increased by above 10000 times, that further causes the flow rate of that branch to be sharply reduced.

Therefore, in the parallel-connected branches of the two-phase cold-plate liquid-cooling system, if the power consumption of the power consuming component is higher, the resistance inside the parallel-connected branches is higher, which causes lower flow rates inside the branches, which even results in dry heating. In the servers 1 according to the present embodiment, the refrigerant inside the first heat exchanger may perform an independent internal circulation, and therefore the parallel-connected branches having the two-phase fluid are omitted, which may overcome the problem of dry heating caused by the higher resistance and lower flow rate with the higher power consumption inside the parallel-connected branches in the related art.

In an embodiment, a mounting hole is formed in the partitioning component 1015. The second heat exchanger 110 is provided inside the mounting hole. The cold-side inlet 1101 and the cold-side outlet 1102 are located within the single-phase submersion region 1012. The hot-side inlet 1103 and the hot-side outlet 1104 are located within the two-phase cold-plate liquid-cooling region 1011. By using such a configuration, that may facilitate the second heat exchanger 110 to be connected to the single-phase submersion region 1012 and the two-phase cold-plate liquid-cooling region 1011.

As an alternative embodiment, the second heat exchanger 110 may also be provided outside the crate 101, and be connected to the first outlet 1014, the second inlet 1071 and the second outlet 1072 by pipelines; or the second heat exchanger 110 is provided within the single-phase submersion region 1012; or the second heat exchanger 110 is provided within the two-phase cold-plate liquid-cooling region 1011.

In an embodiment, a second flow guiding member 1017 is formed within the single-phase submersion region 1012. The second flow guiding member 1017 is adapted for partitioning the interior of the crate 101 into a third refrigerating region and a fourth refrigerating region. The cold-side inlet 1101 is in communication with the third refrigerating region. The first inlet 1013 is in communication with the fourth refrigerating region. A second flowing-through port is formed between the second flow guiding member 1017 and the side wall of the crate 101, and the second power consuming component is provided within both of the third refrigerating region and the fourth refrigerating region.

By using such a configuration, the second flow guiding member 1017 can guide the refrigerant within the single-phase submersion region 1012 to enter the cold-side inlet 1101 of the second heat exchanger 110, and extend the flowing route of the refrigerant within the single-phase submersion region 1012, to facilitate the refrigerant to sufficiently cool the second power consuming component.

In an embodiment, the first inlet 1013 is provided on one side of the single-phase submersion region 1012, and the cold-side inlet 1101 faces the other side of the single-phase submersion region. The second flow guiding member 1017 comprises a first flow guiding plate 10171 and a second flow guiding plate 10172. The first flow guiding plate 10171 extends from the second heat exchanger 110 in the direction away from the first inlet 1013, and is located between two neighboring power consuming components. The second flowing-through port is formed between the first flow guiding plate 10171 and the side wall of the crate 101. One end of the second flow guiding plate 10172 is connected to the second heat exchanger 110, and the other end is connected to the end of the first flow guiding plate 10171 that is closer to the second heat exchanger 110.

The first flow guiding plate 10171 and the second flow guiding plate 10172 are adapted for partitioning the single-phase submersion region 1012 to obtain a serpentine waterway, which effectively extends the flowing route of the refrigerant within the single-phase submersion region 1012, may facilitate the refrigerant to sufficiently cool the second power consuming component within the single-phase submersion region 1012, and guides the refrigerant within the single-phase submersion region 1012 to flow into the cold-side inlet 1101 of the second heat exchanger 110.

In an embodiment, a first circulating pump 109 is provided within the two-phase cold-plate liquid-cooling region 1011. An inputting end of the first circulating pump 109 is connected to the hot-side outlet 1104 of the second heat exchanger 110. An outputting end of the first circulating pump 109 is connected to the hot-side inlet 1103 of the second heat exchanger 110. The first circulating pump 109 is adapted for supplying power to the refrigerant circulation within the two-phase cold-plate liquid-cooling region 1011. Moreover, the inputting end of the first circulating pump 109 is connected to the hot-side outlet 1104 of the second heat exchanger 110, and the refrigerant flowing out of the hot-side outlet 1104 of the second heat exchanger 110 is the liquid-state refrigerant, which does not easily affect the life and the reliability of the circulating pump.

In an embodiment, the first power consuming component comprises an interface 102, a central processing unit 103, a memory bank 104 and a graphics processor 105. The second power consuming component comprises a power-supply unit 106 and a hard disk 108. All of the first power consuming components are components that have a higher power consumption and a higher density and are relatively easy to dissipate heat by using a cold plate, and both of the second power consuming components are components that have a lower power consumption and are not suitable to dissipate heat by using a cold plate. That may ensure that the cooling efficiencies of the parts of the cooling system match with the power consuming components that they correspond to. Preferably, all of the length directions of the power-supply unit 106, the hard disk 108, the interface 102 and the memory bank 104 are configured to be parallel to the flowing direction of the refrigerant, which may further facilitate the refrigerant to sufficiently cool the power consuming components.

The interface 102 is an I/O (Input/Output) interface, and is a component in the hardware that is used by a person or another system to communicate with the computer. The power-supply unit 106 is a PSU (power supply module).

As an alternative embodiment, the hard disk 108 may also be provided within the two-phase cold-plate liquid-cooling region 1011.

In an embodiment, as shown in FIG. 2, the first heat exchanger further comprises a first flow passage 1073 and a second flow passage 1074. The first flow passage 1073 corresponds to the central processing unit 103 and the graphics processor 105. The second flow passage 1074 corresponds to the interface 102 and the memory bank 104. The second inlet 1071 is in communication with a first end of the first flow passage 1073, a second end of the first flow passage 1073 is in communication with a first end of the second flow passage 1074, and a second end of the second flow passage 1074 is in communication with the second outlet 1072.

By using such a configuration, the refrigerant can sequentially cool the central processing unit 103, the graphics processor 105, the interface 102 and the memory bank 104 and subsequently flow out of the second outlet 1072. The refrigerant can preferentially pass through the power consuming components of a higher power consumption, which may enable the cooling efficiency of the condensing system to more match with the demand on cooling of the first power consuming components, to facilitate the refrigerant to more sufficiently cool the first power consuming components.

In an embodiment, the first heat exchanger comprises a first branch 1075 and a second branch 1076 that are connected in parallel to each other. The first branch 1075 corresponds to the central processing unit 103, the second branch 1076 corresponds to the interface 102 and the memory bank 104, the second inlet 1071 is in communication with a first end of the first branch 1075 and a first end of the second branch 1076, and the second outlet 1072 is in communication with a second end of the first branch 1075 and a second end of the second branch 1076. By using such a configuration, the refrigerant, when flowing inside the first heat exchanger, does not require an intensive turning, which may simplify the piping-system layout within the two-phase cold-plate liquid-cooling region 1011, thereby reducing the flow path and the flow resistance of the system.

In an embodiment, the first inlet 1013 and the second outlet 1072 are provided on the same one side of the server 1, which may facilitate the operator to access the server 1 into the liquid-cooling system.

In an embodiment, the central processing unit 103 and the graphics processor 105 are arranged separately in a first direction. The interfaces 102 are provided on the two sides in a second direction of the graphics processor 105, and the memory banks 104 are provided on the two sides in the second direction of the central processing unit 103, wherein the first direction and the second direction are perpendicular to each other. In the present embodiment, the positions of the second power consuming components within the two-phase cold-plate liquid-cooling region 1011 are distributed reasonably, which may enable the two-phase cold-plate liquid-cooling region 1011 to have a more compact internal structure.

According to an embodiment of the present application, in another aspect, there is further provided a liquid-cooling system for a server 1.

Figure 4:
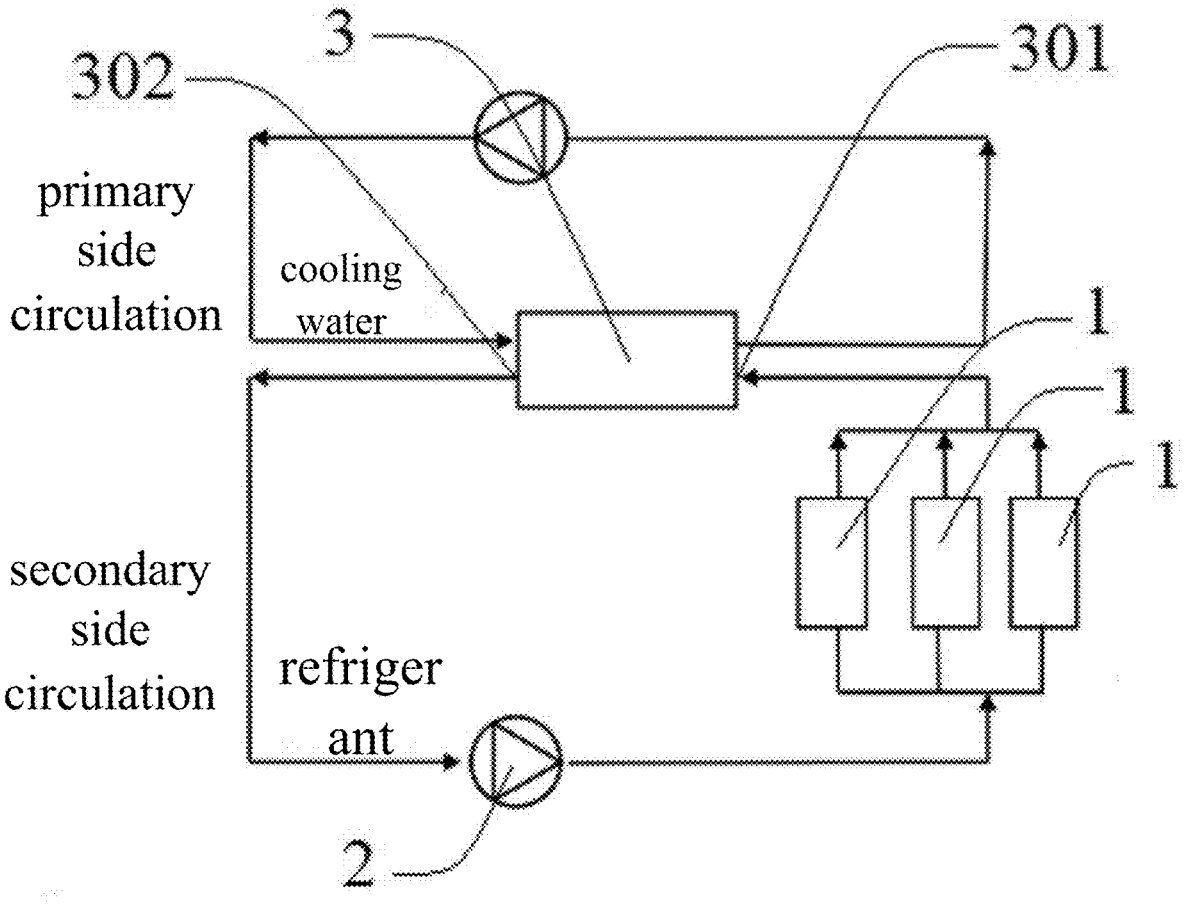
FIG. 4 is a schematic diagram of a liquid-cooling system for a server according to an embodiment of the present application.
Figure 5:
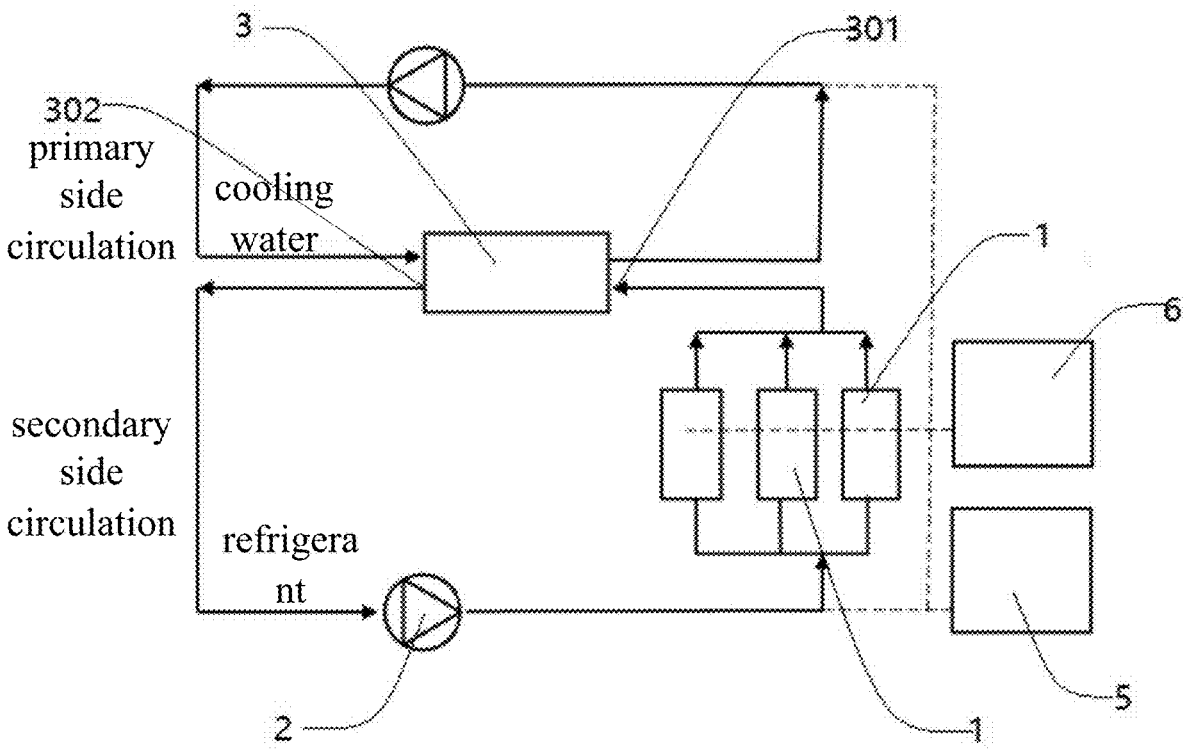
FIG. 5 is a schematic diagram of the system controlling of a liquid-cooling system for a server according to an embodiment of the present application.

The embodiments of the present application will be described below with reference to FIGS. 4 to 5.

The liquid-cooling system according to the present embodiment comprises a server 1 and a condenser 3. The server 1 is the liquid-cooling system in the first aspect of the present application. The condenser 3 has a third inlet 301 and a third outlet 302. The third inlet 301 is connected to a refrigerant outputting port of the server 1, and the third outlet 302 is in communication with a refrigerant inputting port of the server 1.

In the liquid-cooling system according to the present embodiment, in usage, the refrigerant firstly enters the server 1 via the refrigerant inputting port of the server 1, absorbs the heat of the power consuming components, is partially gasified, to change into the two-phase fluid, subsequently releases the heat in the condenser 3, to change back into the liquid state, and repeats the above process.

The liquid-cooling system in the second aspect of the present application comprises or uses the server 1 in the first aspect of the present application, and therefore has its advantageous effects; in other words, it may overcome the defect of the liquid-cooling systems in the prior art that the cooling efficiency does not match with the heat-flux densities of some of the power consuming components inside the crate 101 and it is difficult to satisfy the demand on cooling of the some of the power consuming components.

In an embodiment, the liquid-cooling system further comprises a second circulating pump 2. The inputting end of the second circulating pump 2 is in communication with the third outlet 302 of the condenser 3. The outputting end of the second circulating pump 2 is in communication with the first inlet 1013 of the server 1. The second circulating pump 2 may supply power to the circular flowing of the refrigerant inside the liquid-cooling system.

In an embodiment, the liquid-cooling system further comprises a data collecting module 5 and a controlling module 6, and the data collecting module 5 comprises a first liquid-level sensor, a second liquid-level sensor, a third liquid-level sensor, a first pressure sensor, a second pressure sensor, a first temperature sensor and a second temperature sensor. The first liquid-level sensor is provided at the refrigerant inputting port of the server 1. The second liquid-level sensor is provided at the refrigerant outputting port of the server 1. The third liquid-level sensor is provided at the inputting end of the second circulating pump. The first pressure sensor is provided at the refrigerant inputting port of the server 1. The second pressure sensor is provided at the refrigerant outputting port of the server 1. The first temperature sensor is provided at the refrigerant inputting port of the server 1. The second temperature sensor is provided at the refrigerant outputting port of the server 1.

The controlling module 6 is communicatively connected to the first liquid-level sensor, the second liquid-level sensor, the third liquid-level sensor, the first pressure sensor, the second pressure sensor, the first temperature sensor, the second temperature sensor and the second circulating pump, and is adapted for, according to the detection results of the first liquid-level sensor, the second liquid-level sensor, the third liquid-level sensor, the first pressure sensor, the second pressure sensor, the first temperature sensor and the second temperature sensor, regulating the opening degree of the second circulating pump.

By using such a configuration, the data collecting module 5 may collect in real time the pressure inside the liquid-cooling system, so that the controlling module 6, according to the target values, regulates the opening and closing or the opening degree of the corresponding circulating pump, which may increase the degree of automation of the liquid-cooling system, and prevent errors caused by artificial regulation. The controlling module 6 may comprise a programmable logic control component (such as PLC (Programmable Logic Controller) or CPU (Central Processing Unit)), a memory, electronic elements connected to the programmable logic control component, and so on, which are well known by a person skilled in the art, and are not described in detail herein. Preferably, the server 1 is a plurality of servers 1, which are connected in parallel to each other.

In conclusion, the server 1 in the first aspect of the present embodiment and the liquid-cooling system for a server 1 in the second aspect of the present embodiment have the following advantages:

The present application relates to an advanced research. The present application may be applied in universal products, high-performance products, AI (Artificial Intelligence) server products and so on, and is particularly suitable to be applied in high-power-consumption high-density products. Such products, when employing the technique according to the present application, may easily break through the bottleneck in heat dissipation of high-power-consumption high-heat-flux-density chips, high-density servers and high-power-density cabinets, to satisfy the demand on heat dissipation for above 10 years in future. Moreover, the present application facilitates to protect the environment, save energy, and reduce carbon emission.

Most importantly, the present application may realize the combination between the two-phase cold-plate liquid-cooling technique and the single-phase submersion liquid-cooling technique, to sufficiently utilize the advantages of the two liquid-cooling techniques, solve the problem that the two-phase cold-plate liquid-cooling system is not suitable to be used in low-power-consumption components such as power-supply units and hard disks, and solve the problem in the convenience of the maintenance of the single-phase submersion liquid-cooling system to the largest extent. In addition, the present application also may further solve the problem that the inlet of the circulating pump of the two-phase cold-plate liquid-cooling system requires being provided with complicated systems such as the heat regenerator and the preheater, and thoroughly overcome flow-rate drifting from the parallel-connection dimension of the server, so as to solve the problem of dry heating caused by the higher resistance and lower flow rate with the higher power consumption inside the parallel-connected branches for multiple servers.

Although the embodiments of the present application have been described with reference to the drawings, a person skilled in the art may make various modifications and variations without departing from the spirit and scope of the present application, and all of such modifications and variations fall within the scope defined by the appended claims.

The invention claimed is:

1. A server, wherein the server comprises:

a crate;

a partitioning component provided inside the crate, and adapted for partitioning an interior of the crate into a two-phase cold-plate liquid-cooling region and a single-phase submersion region, wherein the single-phase submersion region and the two-phase cold-plate liquid-cooling region are in heat-exchanging connection;

a first power consuming component provided within the two-phase cold-plate liquid-cooling region;

a second power consuming component provided within the single-phase submersion region, wherein the single-phase submersion region is adapted for performing heat dissipation to the second power consuming component, and a power consumption of the first power consuming component is greater than a power consumption of the second power consuming component; and a first heat exchanger provided on one side of the two-phase cold-plate liquid-cooling region, wherein the first heat exchanger is adapted for cooling the two-phase cold-plate liquid-cooling region;

wherein the crate is provided with a first inlet and a first outlet, both of the first inlet and the first outlet are in communication with the single-phase submersion region, the first heat exchanger has a second inlet and a second outlet, the first inlet is a refrigerant inputting port, the second inlet is in communication with the first outlet, and the second outlet is a refrigerant outputting port; or wherein the crate is provided with a first inlet and a first outlet, the server further comprises a second heat exchanger, the first inlet is a refrigerant inputting port, a cold-side inlet of the second heat exchanger is in communication with the first outlet, and a cold-side outlet of the second heat exchanger is a refrigerant outputting port; and the first heat exchanger comprises a second inlet and a second outlet, the second inlet is in communication with a hot-side outlet of the second heat exchanger, and the second outlet of the first heat exchanger is in communication with a hot-side inlet of the second heat exchanger.

2. The server according to claim 1, wherein a first flow guiding member is provided within the single-phase submersion region, the first flow guiding member is adapted for partitioning an interior of the single-phase submersion region into a first cooling region and a second cooling region, the second power consuming component is provided within both of the first cooling region and the second cooling region, a first flowing-through port is formed between the first cooling region and the second cooling region, the first inlet is in communication with the first cooling region, and the first outlet is in communication with the second cooling region.

3. The server according to claim 2, wherein the first inlet and the first outlet are provided on one side of the single-phase submersion region, and the first flowing-through port is provided on the other side of the single-phase submersion region.

4. The server according to claim 2, wherein the first flow guiding member is a partition plate formed within the single-phase submersion region, one end of the partition plate is connected to a side wall of one side of the single-phase submersion region that is provided with the first inlet, and the other end of the partition plate forms the first flowing-through port with a side wall of the other side of the single-phase submersion region.

5. The server according to claim 1, wherein the first inlet and the first outlet are provided on two sides of the crate, and the second power consuming component is provided between the first inlet and the first outlet.

6. The server according to claim 1, wherein a mounting hole is formed in the partitioning component, the second heat exchanger is provided inside the mounting hole, the cold-side inlet and the cold-side outlet are located within the single-phase submersion region, and the hot-side inlet and the hot-side outlet are located within the two-phase cold-plate liquid-cooling region.

7. The server according to claim 1, wherein a first circulating pump is provided within the two-phase cold-plate liquid-cooling region, an inputting end of the first circulating pump is connected to the hot-side outlet of the second heat exchanger, and an outputting end of the first circulating pump is connected to the hot-side inlet of the second heat exchanger.

8. The server according to claim 1, wherein the first power consuming component comprises an interface, a central processing unit, a memory bank and a graphics processor, and the second power consuming component comprises a power-supply unit and a hard disk.

9. The server according to claim 8, wherein the first heat exchanger further comprises a first flow passage and a second flow passage, the first flow passage corresponds to the central processing unit and the graphics processor, the second flow passage corresponds to the interface and the memory bank, the second inlet is in communication with a first end of the first flow passage, a second end of the first flow passage is in communication with a first end of the second flow passage, and a second end of the second flow passage is in communication with the second outlet.

10. The server according to claim 8, wherein the first heat exchanger comprises a first branch and a second branch that are connected in parallel to each other, the first branch corresponds to the central processing unit, the second branch corresponds to the interface and the memory bank, the second inlet is in communication with a first end of the first branch and a first end of the second branch, and the second outlet is in communication with a second end of the first branch and a second end of the second branch.

11. The server according to claim 8, wherein the central processing unit and the graphics processor are arranged separately in a first direction, the interfaces are provided on two sides in a second direction of the graphics processor, and the memory banks are provided on two sides in the second direction of the central processing unit, wherein the first direction and the second direction are perpendicular to each other.

12. A liquid-cooling system for the server, wherein the system comprises:

the server according to claim 1; and a condenser having a third inlet and a third outlet, wherein the third inlet is connected to a refrigerant outputting port of the server, and the third outlet is in communication with a refrigerant inputting port of the server.

13. The liquid-cooling system according to claim 12, wherein the liquid-cooling system further comprises a second circulating pump, an inputting end of the second circulating pump is in communication with the third outlet of the condenser, and an outputting end of the second circulating pump is in communication with the refrigerant inputting port of the server.

* * * * *